United States Patent [19]

Brown

[11] 4,140,817
[45] Feb. 20, 1979

[54] THICK FILM RESISTOR CIRCUITS
[75] Inventor: John F. Brown, Emmaus, Pa.
[73] Assignee: Bell Telephone Laboratories, Incorporated, Murray Hill, N.J.
[21] Appl. No.: 848,509
[22] Filed: Nov. 4, 1977
[51] Int. Cl.² .................. B05D 5/12; H01C 17/06
[52] U.S. Cl. ..................................... 427/96; 427/102; 427/103; 427/123; 427/126; 427/343; 427/377; 427/380; 29/620
[58] Field of Search ............... 427/102, 103, 380, 377, 427/126, 343, 123, 282, 265, 95; 29/620; 252/518

[56] References Cited
U.S. PATENT DOCUMENTS
3,998,980  12/1976  Antes et al. ........................ 427/103

OTHER PUBLICATIONS
Loasby et al., "Enhanced Property . . . Pastes", Solid State Tech. (5-1972), pp. 46-50 & 72 (correction 8-72, p. 57).

Katz, "Adhesion Copper Films . . . Interface", Thin Film Solids, vol. 33, pp. 99–105 (1976).

Primary Examiner—Michael F. Esposito
Attorney, Agent, or Firm—Lester H. Birnbaum

[57] ABSTRACT

Disclosed is a method and resulting product whereby thick film conductors which require a reducing firing atmosphere may be included in circuits with thick film resistors requiring an oxidizing firing atmosphere. In accordance with one embodiment, a fritless paste including copper is deposited onto a substrate in a desired conductor pattern and fired to establish adhesion. The copper oxide in the pattern is then reduced to copper metal at a high temperature. This is followed by oxidation of the copper to produce a copper oxide of lower density than the oxide formed after the initial firing. The resistor material is then deposited and fired in an oxidizing atmosphere. The low density copper oxide may then be reduced at a low temperature so that resistor properties are not adversely affected.

9 Claims, 1 Drawing Figure

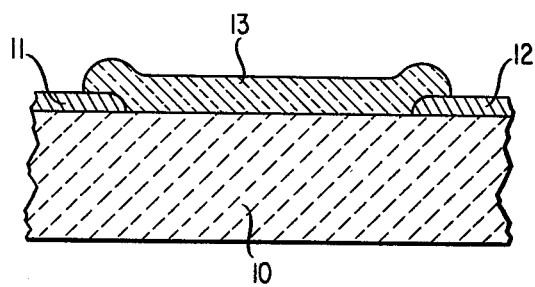

THICK FILM RESISTOR CIRCUITS

BACKGROUND OF THE INVENTION

This invention relates to thick film circuits and means of fabricating such circuits.

Most thick film circuits presently in use employ a conductor system which is based on the noble metals silver, gold, palladium and platinum, alone or in combination, and a resistor material including ruthenium oxide. Typically, the conductor paste is screen printed onto a ceramic substrate and then fired at temperatures of the order of 950 degrees C. in air. This is followed by screen printing the resistor paste and firing in air at a temperature of approximately 850 degrees C. in air. (See, for example, U.S. Pat. No. 3,998,980 issued to Antes et al.)

Although such circuits are generally satisfactory, several problems exist with the use of precious metal conductor pastes. The primary concern is the rising cost of such precious metals which seriously threatens the economies of thick film technology. In addition, migration of silver across the substrate surface or through dielectrics can cause short circuits thereby restricting use of silver alloy pastes. Furthermore, conductor pastes including silver, gold and palladium can cause poor solderability performance.

As a result of these problems, workers in the art have actively sought alternatives to the precious metal pastes. A copper-based conductor has been considered as one possibility (see, for example, Loasby et al, "Enhanced Property Thick-Film Conductor Pastes," *Solid State Technology*, May, 1972, p. 46). However, commercially available copper pastes which include glass frits require firing in an atmosphere of nitrogen, and such processing is incompatible with the resistor material. Although it is recognized that copper pastes may be made without glass frits, such materials require a high temperature firing in an oxidizing atmosphere followed by an additional firing in a reducing atmosphere which causes severe degradation of the resistor materials requiring an oxidizing atmosphere.

It is therefore a primary object of the invention to provide a fabrication technique whereby a low cost thick film conductor requiring a reducing atmosphere is made compatible with a thick film resistor requiring an oxidizing atmosphere.

SUMMARY OF THE INVENTION

This and other objects are achieved in accordance with the invention. According to one embodiment, a fritless copper paste is screen printed on an alumina substrate, dried, and fired in air so that the material adheres to the substrate. The resulting copper oxide is reduced to copper metal by heating in an atmosphere including hydrogen at a high temperature, followed by re-oxidizing in air to produce a low density copper oxide. The resistor material is then screen printed onto selected areas, dried and fired in air. The low density copper oxide can then be reduced at a low temperature to produce the desired conductivity with no significant adverse effect on resistor properties.

BRIEF DESCRIPTION OF THE DRAWING

These and other features of the invention are delineated in detail in the following description together with the FIGURE which is a cross-sectional view of a portion of a thick film circuit fabricated in accordance with one embodiment of the invention.

It will be appreciated that for purposes of illustration this FIGURE is not made to scale.

DETAILED DESCRIPTION

Fabrication of the circuit begins with a substrate, 10, which is usually composed of approximately 96% $Al_2O_3$. The surface of the substrate was cleaned in accordance with standard techniques. A copper paste was prepared in accordance with one feature of the invention without the glass frits usually utilized for adhesion. The paste consisted of approximately 75% by weight of copper metal and approximately 25% by weight of an organic binder. In this example, the binder was 2 gms of ethyl cellulose dissolved in 9 mls of alphaterpeniol and 9 mls of butyl carbitol acetate. It will be appreciated that other binders may be employed. In addition, the concentration of metal and binder may be varied, with the metal concentration ranging from 10-95 percent and the binder from 5-90 percent.

The conductor paste was screen printed on the substrate using a 325 mesh screen and a 0.6 mil emulsion pattern to produce the dried conductor pattern including elements 11 and 12 with a thickness of 0.9 mil. The thickness of the deposited material is preferably in the range 0.5-1.5 mil. The paste was dried, in this example, at a temperature of approximately 125 degrees C. for 10 minutes and then fired in air. The firing step establishes adhesion between the conductor and the substrate by the formation of copper oxide which reacts with the alumina substrate to form copper aluminate spinel at the interface. To insure adequate adhesion, it is recommended that firing be done in the temperature range 1120-1220 degrees C. for 10 min-1 hour. In this example, the paste was fired at 1125 degrees for 30 minutes.

In accordance with a key step in the inventive method, the copper oxide was then reduced to copper metal at a temperature of at least 700 degrees C. The reducing ambient can be hydrogen alone or a mixture of hydrogen and nitrogen, preferably with an amount of hydrogen of at least 2%. The reduction reaction is preferably carried out until essentially all the copper oxide is converted to copper. The necessary time and temperature can be determined by a physical inspection of the color of a lapped sample, which changes from a completely black color (copper oxide) to the reddish color of copper with the exception of the spinel at the substrate interface. Alternatively, resistivity measurements can be made periodically. A minimum temperature of 700 degrees C. is needed to ultimately achieve a sufficiently low resistivity for commercially practical thick film circuits. That is, when the processing is completed, the resistivity of the conductor elements should be no greater than 0.1 ohms/square. In this example, reduction was accomplished by heating at 1,000 degrees C. for 30 minutes. A useful range appears to be heating at 700-1100 degrees C. for 10-60 minutes.

Next, the copper has re-oxidized by heating in air at a temperature of approximately 850 degrees C. for 10 minutes. Again, it is desirable to convert essentially all of the copper to copper oxide. This step, in combination with the previous reduction reaction, is designed to produce a copper oxide which is less dense than the oxide formed after the initial firing of the conductor paste as evidenced by the change in thickness of the conductor layer. That is, whereas the initial copper oxide layer typically had a thickness of 0.5 mil, the thickness of the oxide layer after this step was 0.7 mil. It is recommended that the change in density fall within the range 10–80%. It was discovered that if the resistors were deposited and fired after the initial firing of the conductors, the subsequent high temperature reduction would cause severe degradation of the resistors. If the resistors were deposited and fired after the high temperature reduction, a reaction took place which caused severe degradation of both resistor and conductor material where they overlap. The high temperature reduction and re-oxidation were therefor necessary prior to resistor formation so that subsequent processing would be compatible with both resistor and conductor material.

The re-oxidation step will preferably closely match the firing requirements of the resistor material to be deposited. In general, however, the temperature can range from 250–950 degrees C. and the time from 5 minutes to one hour, so long as the resulting oxide can be reduced at a sufficiently low temperature after resistor fabrication to achieve the desired conductivity without significantly degrading the resistor material.

The resistors, such as 13, were then deposited onto selected areas of the circuit by screen printing resistor paste through a 200 mesh screen with a 0.8 mil thick emulsion pattern. Thickness after drying typically ranges from 0.5–1.5 mil. The particular material used was a resistor ink containing bismuth ruthenium oxide which is sold by DuPont under the designation "Birox". The invention is most beneficial with all ruthenium-based resistor materials, and in general may be utilized with any resistor material which must be fired in an oxidizing ambient.

After deposition, the resistor material was dried in accordance with standard techniques at a temperature of 125 degrees C. for 10 minutes. Firing was effected in air at a temperature of approximately 850 degrees C. for 10 minutes, which was recommended by the manufacturer of the material to achieve a resistivity of 100K ohms/square. Of course, other resistor materials that are available to provide a full range of resistivities can be processed in the same way.

Subsequent to the resistor processing, the copper oxide in the conductor pattern was reduced by heating in an ambient of 10% $H_2$ and 90% at approximately 260 degrees C. for 30 minutes. This resulted in a final conductor resistivity of approximately 0.01 ohms/square. Due to the low density of the copper oxide formed in the previous steps, a sufficiently low temperature can be utilized to achieve the desired conductivity while keeping resistor properties within tight tolerances. With these considerations in mind, a recommended range is heating at 250 degrees C.–450 degrees C. for 5 minutes–1 hour. Again, the reducing ambient can be hydrogen alone or a combination of hydrogen and nitrogen.

Circuits fabricated in accordance with the above-described embodiment consistently resulted in the desired low resistivity for the conductors, while at the same time keeping the resistivity of the resistors within the required range. Thus, it was demonstrated that the processing of the conductors had no significant adverse effect on resistor properties and vice-versa.

Although a particular conductor paste has been described, it will be apparent that other materials may be employed in accordance with the principles of the invention. For example, the copper metal in the prepared paste can be replaced by copper oxide and the same procedure followed. In addition, other low cost metals which require a reducing atmosphere and exhibit characteristics similar to copper in response to oxidation and reduction reactions may be substituted for the copper. Such metals include nickel, cobalt, titanium, chromium, cadmium and vanadium.

Various additional modifications will become apparent to those skilled in the art. All such variations which basically rely on the teachings through which the invention has advanced the art are properly considered within the spirit and scope of the invention.

What is claimed is:

1. A method of fabricating a thick film circuit on a substrate comprising the steps of:
    depositing a fritless paste comprising a material selected from the group consisting of a metal and a metal oxide onto the substrate in a desired conductor pattern;
    heating the resulting structure in an oxidizing atmosphere at a temperature sufficient to establish adhesion between the paste and substrate;
    heating the structure at a high temperature in a reducing atmosphere to convert the resulting metal oxide to the metal;
    heating the structure in an oxidizing atmosphere to convert the metal to a lower density metal oxide;
    forming a resistor material on said substrate and portions of said conductor pattern;
    heating the resulting structure in an oxidizing atmosphere to establish a desired resistivity of the resistor material; and
    heating the structure at a low temperature in a reducing atmosphere to convert the lower density metal oxide to metal and establish a desired resistivity for the conductor pattern.

2. The method according to claim 1 wherein the metal is selected from the group consisting of copper, nickel, cobalt, titanium, chromium, cadmium and vanadium.

3. The method according to claim 1 wherein the metal is copper.

4. The method according to claim 1 wherein the resistor material comprises ruthenium oxide.

5. The method according to claim 1 wherein the heating at a high temperature in a reducing atmosphere is done at a temperature of at least 700 degrees C.

6. The method according to claim 1 wherein the structure is heated in air at a temperature of 1100–1220 degrees C. for 10 minutes–1 hour, then heated at a temperature of 700–1100 degrees C. for 10–60 minutes in an atmosphere of at least 2% hydrogen followed by heating in air at a temperature of 250–950 degrees C. for 5 minutes to 1 hour, and subsequent to formation of the resistors, the structure is heated in an atmosphere of at least 2% hydrogen at a temperature in the range of 250–450 degrees C. for 5 minutes to 1 hour.

7. The method according to claim 1 wherein the desired resistivity of the conductor pattern is no greater than 0.1 ohms/square.

8. The method according to claim 1 wherein the substrate comprises alumina.

9. A method of fabricating a thick film circuit on an alumina substrate comprising the steps of:
    screen printing a fritless paste comprising copper and an organic binder onto the substrate in a desired conductor pattern;
    heating the resulting structure in an oxidizing atmosphere at a temperature sufficient to establish adhesion between the copper and substrate;

heating the structure at a temperature of 700 degrees–1100 degrees C. in a reducing atmosphere for 10–60 minutes to convert the resulting copper oxide to copper;

heating the structure in an oxidizing atmosphere at a temperature of 250–950 degrees C. for 5 minutes to 1 hour to convert the resulting copper to a lower density copper oxide;

forming a ruthenium-based resistor material on said substrate and portions of said conductor pattern;

heating the resulting structure in an oxidizing atmosphere for a time and temperature sufficient to establish a desired resistivity of the resistor material, and heating the structure in a reducing atmosphere at a temperature of 250–450 degrees C. for 5 minutes to 1 hour to convert the lower density copper oxide to copper and establish a resistivity of the conductor pattern no greater than 0.1 ohms/square.

* * * * *

UNITED STATES PATENT AND TRADEMARK OFFICE
CERTIFICATE OF CORRECTION

PATENT NO. : 4,140,817
DATED : February 20, 1979
INVENTOR(S) : John F. Brown

It is certified that error appears in the above-identified patent and that said Letters Patent are hereby corrected as shown below:

Column 3, line 45, "90%" should read --90% $N_2$--.

Signed and Sealed this

Second Day of October 1979

[SEAL]

Attest:

RUTH C. MASON
Attesting Officer

LUTRELLE F. PARKER
Acting Commissioner of Patents and Trademarks